(12) United States Patent
Erickson et al.

(10) Patent No.: US 8,921,199 B1
(45) Date of Patent: Dec. 30, 2014

(54) PRECISION IC RESISTOR FABRICATION

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/032,784

(22) Filed: Sep. 20, 2013

(51) Int. Cl.
  *H01L 21/20* (2006.01)
  *H01L 49/02* (2006.01)
(52) U.S. Cl.
  CPC ...................... *H01L 28/20* (2013.01)
  USPC ............ 438/382; 438/694; 438/700; 438/710
(58) Field of Classification Search
  CPC .............. H01L 21/31116; H01L 28/20; H01L 21/31144
  See application file for complete search history.

(56) References Cited

U.S. PATENT DOCUMENTS

| 5,352,923 | A | * | 10/1994 | Boyd et al. ................... 257/536 |
| 5,899,724 | A | | 5/1999 | Dobuzinsky et al. |
| 6,534,374 | B2 | | 3/2003 | Johnson et al. |
| 7,084,483 | B2 | | 8/2006 | Aitken et al. |
| 7,323,751 | B2 | | 1/2008 | Beach et al. |
| 7,375,000 | B2 | | 5/2008 | Nowak et al. |
| 7,601,602 | B2 | | 10/2009 | Aitken et al. |
| 7,803,687 | B2 | | 9/2010 | Chiu et al. |
| 8,071,457 | B2 | | 12/2011 | Soss |
| 2011/0115047 | A1 | * | 5/2011 | Hebert et al. ................. 257/508 |

OTHER PUBLICATIONS

Siemens AG, et al., "Integration of a TiN Liner in AlCu BEOL as a Resistance Level", IP.com Prior Art Database, Sep. 25, 2003. IP.com Number: IPCOM000019036D. Copyright: Siemens AG 2003.

* cited by examiner

*Primary Examiner* — Alexander Ghyka
*Assistant Examiner* — Hanh D Tran
(74) *Attorney, Agent, or Firm* — Robert R. Williams (57) ABSTRACT

A method for fabricating a resistor in a dielectric layer of an integrated circuit (IC) is disclosed. The method may include creating a trench with a first side, a second side opposing the first side, and a bottom, in the dielectric layer, and depositing a conformal film onto the first side, the second side and the bottom of the trench. The method may also include removing the conformal film from the bottom and the second side of the trench, and filling the trench with an insulator. The method may also include removing the conformal film from the first side of the trench to form a receptacle adjacent to the insulator, and depositing electrically resistive material into the receptacle to form a resistor.

18 Claims, 5 Drawing Sheets

PRECISION IC RESISTOR FABRICATION

TECHNICAL FIELD

The present disclosure relates to integrated circuits (ICs). In particular, this disclosure relates to fabricating precision resistors in a wiring plane of an IC.

BACKGROUND

A resistor is a passive two-terminal electrical component that implements electrical resistance as a circuit element. Resistors may be useful and implemented within a variety of kinds of integrated circuits, particularly analog integrated circuits.

The structure of a resistor may include low ohmic connections that enable electrical and physical connection of the resistor to conductors and/or other circuit elements within the IC. A resistor may have a tolerance which may be a limited allowable deviation from a designed or specified resistance value. Resistor tolerances may be specified as a percent of the specified target resistance value, for example 10%. Circuits employing resistors with small tolerance values may perform and produce outputs with greater predictability than circuits employing resistors with large tolerances.

SUMMARY

Various aspects of the present disclosure may be useful for creating a precision resistor having a predictable and consistent resistance value, for use as a circuit element within an integrated circuit (IC). An IC designed according to embodiments of the present disclosure may include circuits that perform with enhanced precision and consistency.

Embodiments may be directed towards a method for fabricating a resistor in a dielectric layer of an integrated circuit (IC). The method can include creating a trench in the dielectric layer, the trench having a first side, a second side opposing the first side and a bottom, and depositing a conformal film onto the first side, the second side and the bottom of the trench. The method can also include removing the conformal film from the bottom and the second side of the trench, and filling the trench with an insulator. The method can further include removing the conformal film from the first side of the trench to form a receptacle adjacent to the insulator, and depositing electrically resistive material into the receptacle to form a resistor.

Embodiments may also be directed towards a method for fabricating a resistor with low ohmic connection areas in a dielectric layer of an integrated circuit (IC). The method can include creating a first trench having a first side, a second side opposing the first side and a bottom, in the dielectric layer, and depositing a conformal film onto the first side, the second side and the bottom of the first trench. The method can also include removing the conformal film from the bottom and the second side of the first trench, filling the first trench with an insulator, and removing the conformal film from the first side of the first trench to form a receptacle adjacent to the insulator. The method can further include creating a second trench adjoining the receptacle, with a plurality of sides and a bottom, and depositing electrically resistive material onto at least one side and the bottom of the second trench and into the receptacle to form a resistor in the receptacle, and filling the second trench with a conductive material to form a low ohmic connection to the resistor.

Embodiments may also be directed towards a method for fabricating a resistor in a dielectric layer of an integrated circuit (IC). The method can include creating a trench of a controlled depth, having a first side, a second side opposing the first side and a bottom in the dielectric layer, and depositing a conformal film of a controlled thickness onto the first side, the second side and the bottom of the trench. The method can also include removing the conformal film from the bottom of the trench, and applying a mask having a minimum allowable aperture width at least two times greater than the controlled thickness of the conformal film on the first side of the trench. The method can further include removing the conformal film from the second side of the trench by positioning an aperture of the mask to expose the conformal film on the second side of the trench to light during a photolithographic process, and to block the conformal film on the first side of the trench from exposure to light during the photolithographic process. The method can further include filling the trench with an insulator, removing the conformal film from the first side of the trench to form a receptacle adjacent to the insulator, and depositing electrically resistive material into the receptacle, to form a resistor with a controlled resistance.

Aspects of the various embodiments may be used to fabricate a resistor having precisely controlled physical dimensions, which may result in a resistor having a small resistance tolerance value. Aspects of the various embodiments may also be useful for creating an area-efficient resistor that may be easily accessible and customizable in a conductor layer of an IC.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes.

DETAILED DESCRIPTION

Certain embodiments of the present disclosure can be appreciated in the context of a precision resistor for use in various analog circuits within an IC. Such analog circuits may include but are not limited to amplifiers, filters, D/A converters, A/D converters, mixers, oscillators and PLLs. While not necessarily limited thereto, embodiments discussed in this context can facilitate an understanding of various aspects of the disclosure. Certain embodiments may also be directed towards other equipment and associated applications, such as a precision resistor for use in various digital circuits within an IC. Such digital circuits may include but are not limited to transmission line terminators and input pull-up/pull-down devices.

In general, various embodiments of the present disclosure relate to electrically resistive structures (resistors) that may be designed and fabricated within a single integrated circuit (IC) conductor layer, and thereby provide an area-efficient, resistive circuit element having a low resistor tolerance value. Area-efficiency may result from a small resistor footprint located within a conductor layer that may be sparsely populated. According to certain embodiments, an IC constructed with a layer including the resistive structures may be compliant with existing and proven IC manufacturing processes and material sets. The layers including the resistive structures may be particularly useful as a cost-effective way to add accessible, high precision resistors to IC designs. An IC constructed according to embodiments of the present disclosure may be configured to be customizable late in an IC fabrication process, and to produce output signals that may be predictable and repeatable.

Resistors formed in conductor layers above the silicon (active device) layer of an IC may be useful in allowing the IC to be customized by removing, adding or rearranging the orientation of conductors to the resistor. These operations may be substantially less complicated than customizing resistors formed at the device level, and may make an IC having these resistors useful and versatile.

Certain embodiments can be particularly useful by using aspects of known fabrication processes to create an electrically resistive structure, which may facilitate low cost, reliable solutions not requiring substantial development time, effort or expense to implement.

Certain embodiments relate to the formation of precision resistors within an IC for use in analog circuits. Resistors can be very useful circuit elements within the design of an advanced IC, especially when incorporated into analog circuits. Resistors may be used to limit or balance current flow, form voltage dividers, program the gain of amplifiers, and convert a current to a voltage level in an analog circuit. The accuracy of an analog circuit, for example, one that converts a current to a voltage level, may depend directly on the precision of a particular resistor value. In some applications, I/O pin count and electrical parasitic limitations may make interconnection of circuit elements within the IC to resistors external to the IC impractical.

A resistor may be formed within an integrated circuit in a diffusion layer or a polysilicon layer, and may have low ohmic connections (at each end of the resistive element) that allow it to be connected to other circuit elements. Resistors formed using diffusion or polysilicon layers may exhibit relatively large resistive tolerances as a result of the combined effects of several factors, and in some applications a diffusion resistor tolerance may be as high as 40% of its specified resistance value. High resistive tolerances may result from high end— . . . area resistances and tolerances, which may be a significant portion of a diffusion resistor's overall resistance. High sheet resistance variability (due to implant depth and concentration variations, and implant region width/length variations) may also contribute to a diffusion resistor's overall tolerance value.

Diffusion area resistors may consume large amounts of silicon area in regions that may be used for active devices such as transistors, and may be specified to have increased physical dimensions to offset large dimensional tolerances. The ongoing trends of shrinking transistor sizes, vertical transistors (FinFETs) and other silicon area constraints make diffusion area resistors relatively costly with respect to the silicon area they may consume.

Circuits requiring precisely controlled output signals may be designed using resistors with relatively large tolerances, however, design techniques often involve the use of supplementary active devices (transistors, diodes) and matching of the values of two or more similar resistors, fabricated near each other on the IC. These techniques may result in greater silicon area consumption than design techniques involving resistors with low tolerances.

An electrically resistive material may generally be a material with a resistivity significantly greater than a material used as an electrical conductor. For example, in one application, an electrically resistive material having a sheet resistivity (Ohms per square) of approximately 1000 times the sheet resistivity of a conductor material may be useful in creating precision resistors. An electrically resistive material may generally be several orders of magnitude more conductive than a material used as an insulator. For example, titanium nitride (TiN), an electrically resistive material, has a resistivity of approximately 1.3E6 Ohms-Meter, while silicon dioxide ($SiO_2$), an insulating (dielectric) material used in the fabrication of ICs, has a resistivity of 1.0E16 Ohms-Meter, several orders of magnitude higher.

For purposes of this discussion, the term "light" refers to the portion of the electromagnetic spectrum that may be generally useful for photolithographic process steps, such as the exposure of a light-sensitive material such as a photoresist. It may be understood that this portion of the electromagnetic spectrum may extend beyond the range of light generally understood to be visible by the human eye (approximately 390 nm to 780 nm). Wavelengths used in photolithographic process may extend into the ultraviolet or X-ray portion of the electro-magnetic spectrum, due to the compatibility of these wavelengths with small photomask apertures.

It may be understood that some level of material or chemical impurities may exist as a result of a process designed to deposit or form a certain type of material. For example, in a process step designed to deposit titanium nitride, it can be appreciated that the material actually deposited may be substantially titanium nitride, although some small amount of impurities may also be included, as an unintended result of the deposition process.

Certain figures show only a single resistive structure, however, embodiments may include a plurality of resistive structures, and a plurality of planar layers, each containing one or more resistive structures. A planar dielectric layer may include trenches used to contain conductors and/or resistive structures within the dielectric. The terms "dielectric layer" and "conductor layer" may therefore both be used in reference to a single physical layer structure containing both dielectric material and conductive and/or resistive material. While all figures illustrate the principles and features of the present disclosure, they are not necessarily drawn to scale.

Figure 1:
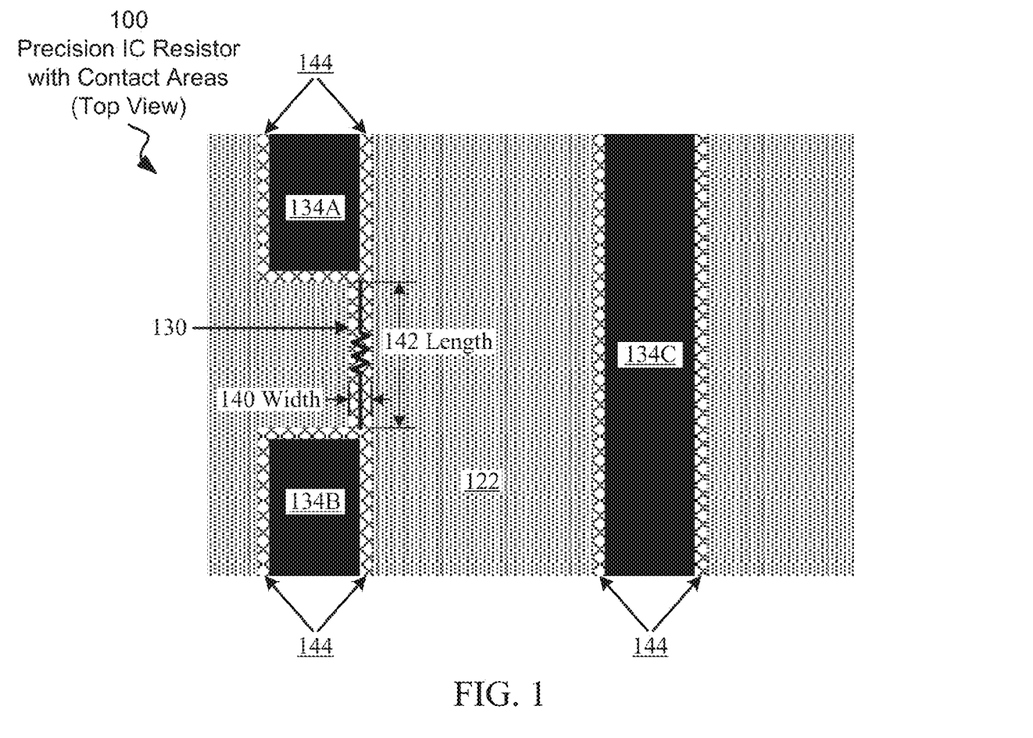
FIG. 1 is a top view of a precision IC resistor, including low ohmic connection areas to the resistor, and a conductor, according to embodiments of the present disclosure.

FIG. 1 depicts a top view of a precision IC resistor 130, low ohmic connection areas 134A, 134B, and conductor 134C, fabricated within a dielectric layer 122 of an integrated circuit (IC). Resistor 130 may be generally used as a circuit element within the IC, according to embodiments of the present disclosure. The tolerances of physical dimensions of the resistor 130 may be closely controlled during its fabrication process, and may result in the resistor having a precisely controlled (low deviation from a specified value) resistance, or low resistor tolerance.

Electrically resistive material 144 may be used to construct the resistor 130 and may also provide an electrical connection between the resistor 130 and low ohmic connections 134A, 134B. The electrical resistance of resistor 130 may be substantially determined by length 142. Low ohmic connections 134A, 134B may be fabricated from an electrically conductive material such as copper or aluminum, and may be connected to additional electrical conductors, to connect resistor 130 to other circuit elements within the IC.

The embodiment depicted in FIG. 1 includes the precision resistor 130 and low ohmic connections 134A, 134B created within a trench in the dielectric layer 122, consistent with trenches which may be formed to contain signal and power conductors within an IC.

Precise control of the physical dimensions (width 140 and length 142) of the resistor 130 during its fabrication process may yield similarly precise control of its resistance value, which may result in robust, consistent and predictable circuit performance for an IC that incorporates it. The resistor 130 may provide performance enhancements for both analog and digital types of circuits.

Figure 1A:
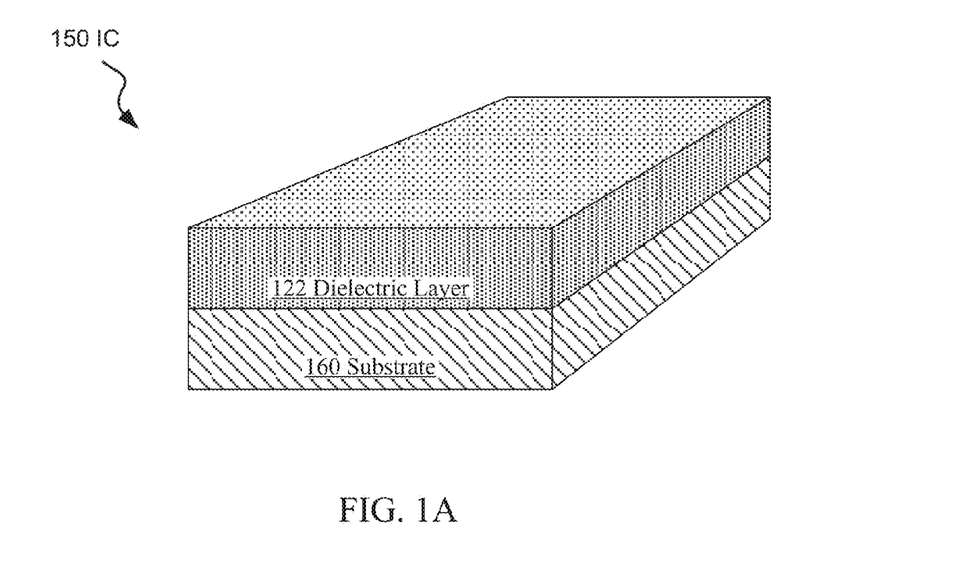
FIG. 1A is an isometric drawing of an IC, including a substrate and a dielectric layer, according to embodiments of the present disclosure.

FIG. 1A is an isometric drawing of an IC 150, including a substrate 160 and a dielectric layer 122, according to embodiments of the present disclosure. The substrate 160 may be a thin slice of semiconductor material, such as a silicon crystal, used in the fabrication of integrated circuits, and may have microelectronic devices, such as transistors, fabricated within it.

Dielectric layer 122 may be formed on the top (active device) surface of substrate 160, and may contain electrically conductive material used to form connections between circuit elements of the IC 150. Dielectric layer 122 (FIG. 1A) is consistent with similar layers in FIGS. 1, 2, 2A and 3. FIG. 1A illustrates an embodiment of an IC 150; other embodiments may include additional dielectric layers similar to dielectric layer 122, formed in a stacked, planar arrangement on top of substrate 150.

Figure 2:
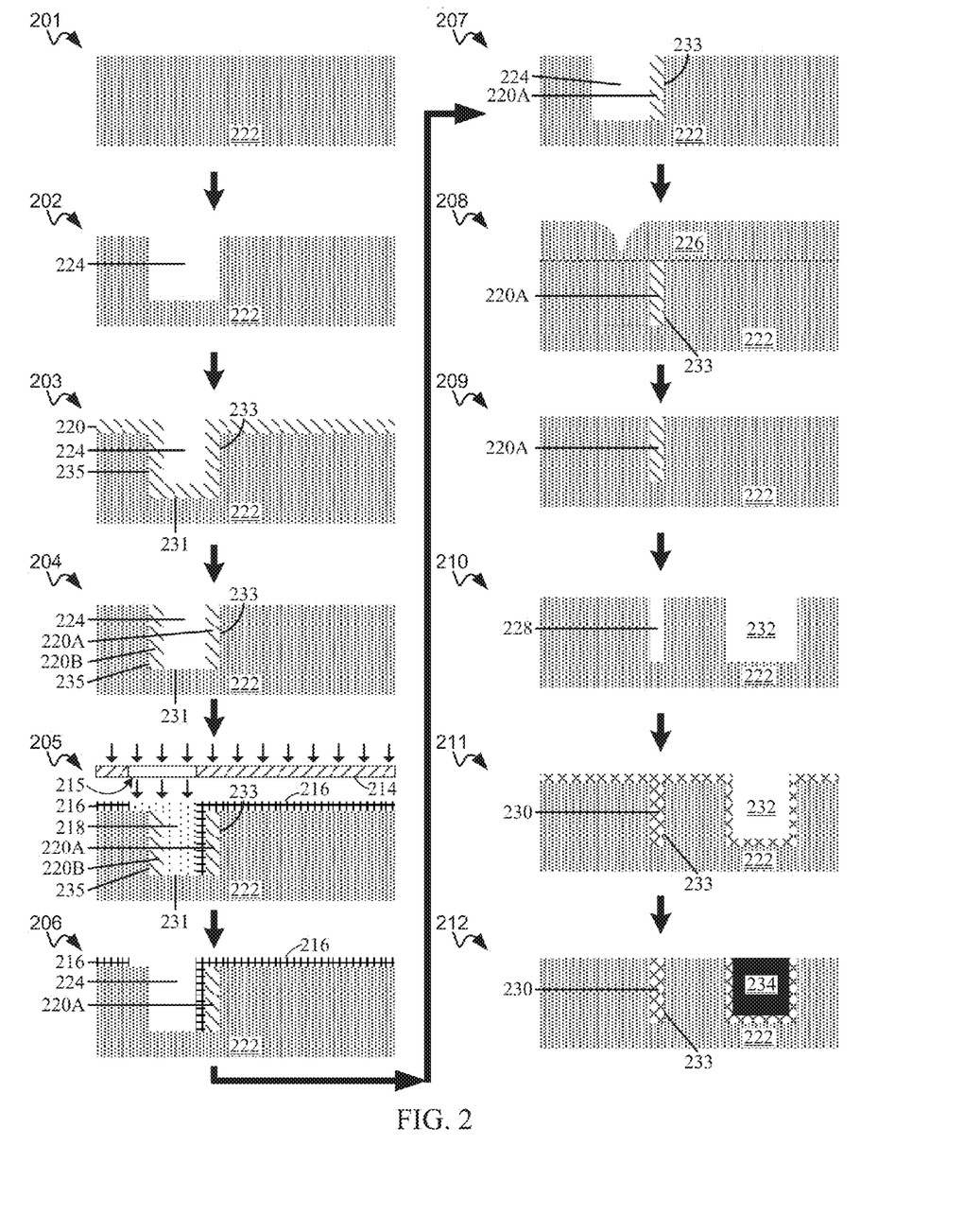
FIG. 2 includes twelve cross-sectional views illustrating the results of process steps for fabricating a precision IC resistor, according to embodiments.

FIG. 2 includes twelve cross-sectional views (201 through 212) illustrating the results of a sequential set of process steps for fabricating a precision IC resistor 230 (view 212) in a dielectric layer 222 of an IC, according to embodiments of the present disclosure. These views illustrate an example process; other views and steps may be possible. A resistor 230 formed by these process steps may be consistent with resistor 130 (FIG. 1) and may have low ohmic connection areas consistent with low ohmic connections 134A, 134B (FIG. 1).

The progression depicted in views 201 through 212 begins with a planar dielectric layer 222 of an IC (view 201) and ends with a completed precision IC resistor 230 (view 212). Process steps may be completed within structural layers which may be presently used for IC fabrication, such as dielectric layer 222. A precision resistor fabricated using these process steps may be a particularly useful component when incorporated into circuits within an IC. Low ohmic connections such as 234 (view 212) may be formed at each end of the resistor 230, and may generally be used to interconnect the resistor to other circuit elements within the IC, consistent with resistor 130 and low ohmic connection areas 134A, 134B (FIG. 1).

The results of one or more process steps may be depicted in each view. For example, a view may depict the results of an etching process, which may also include photomask steps (apply, expose, develop, remove) that support the etching process. Processing steps associated with views 201 through 212 may include, but are not limited to etching, material layer deposition, photolithographic masking processes and insulator (oxide) growth or deposition.

Completed structures may be generally shown in the views as having rectangular cross-sectional profiles, with surfaces orthogonal to each other. This depiction, however, is not limiting; structures may be of any suitable shape, size and profile, in accordance with specific design criteria, lithographic and manufacturing process limitations and tolerances for a given application. For example, corners shown as having right angles may be rounded, surfaces may have a non-orthogonal relative orientation, and relative dimensional ratios may vary from those depicted in the figures.

View 201 depicts a planar dielectric layer 222 of an IC. An IC may include several stacked planar dielectric layers, similar to dielectric layer 222, which may be designed to contain and insulate electrical conductors formed within them. Dielectric layers may be formed in a planar orientation above the active circuit (i.e., transistor) layer of an IC, and may generally cover the entire exposed surface of a previously formed layer. The thickness of a dielectric layer such as 222 may be specified for a given application (for example, containing conductors that may interconnect transistors created in an IC's active layer) and may not need to be modified for embodiments of the present disclosure. Silicon dioxide may be used for the dielectric layer 222, due to its use in IC fabrication. Other suitable insulator materials may also be used.

View 202 depicts the dielectric layer 222 with a trench 224 created in its top surface. The width and depth of trench 224 may be specified to be consistent with dimensions of dielectric trenches used to contain conductors suitable to a particular application, for example, signal transmission or power distribution. Either side of the trench 224 may be particularly useful as a surface on which to form a resistive structure.

The trench 224 may be formed through an etching process, such as plasma etching or reactive ion etching (RIE), which may involve applying a photomask to define trench boundaries, exposing and developing lines in the photoresist, etching one or more trenches in the dielectric layer 222, and stripping off the remaining photomask. Controlling the duration of the etching process used to create trench 224 may result in precise control of its depth, which may be useful in creating a surface that may help define the formation of a precision resistor structure. Trench 224 may be created to contain only resistive elements, or to contain resistive elements in combination with conductors.

A minimum width of the trench 224 may be limited by a minimum allowable aperture width of a photolithographic process used in conjunction with etching the trench. For example, a mask aperture width may be specified to be equal to a certain fraction of the particular wavelength of the light used to expose a photoresist coating prior to trench etching, and may thus be limited by the wavelength of the light.

View 203 depicts the trench 224 with a conformal film 220 deposited on the bottom 231, first side 233, and second side 235 of the trench 224. The thickness of conformal film 220 may be specified and fabricated to be suitable for creation of a resistive structure having a specified sheet resistivity.

The conformal film 220 may be created through a deposition process, such as chemical vapor deposition (CVD), or a variant such as plasma-enhanced chemical vapor deposition (PECVD). A photolithographic process may also be used to define suitable areas for conformal film deposition. Controlling the duration of the deposition process used to create conformal film 220 may result in accurate control of its thickness, which may be useful in creating a precisely dimensioned placeholder for defining a resistor structure in subsequent steps.

The minimum thickness of conformal film 220 may be significantly less than a minimum width of the trench 224, resulting from the relatively slow deposition process, which may be of a precisely controlled duration. In some embodiments, for example, the conformal film 220 thickness may be 10% of the minimum width of the trench 224. Conformal film 220 may be silicon nitride (Si3N4), or another suitable material.

View 204 depicts trench 224 with the conformal film 220 removed from the bottom 231 of the trench 224 and from the top surface of dielectric layer 222, leaving conformal films 220A and 220B on the first side 233 and the second side 235 of the trench 224, respectively. Either conformal film 220A or 220B may be useful in subsequent steps as a placeholder for creating a receptacle with precisely controlled dimensions.

The conformal film 220 may be removed through an anisotropic etching process, which may selectively remove the conformal film deposited on the bottom 231 of the trench 224 and on the top surface of dielectric layer 222, but may not remove the conformal film deposited on the trench 224 sides 233 and 235.

View 205 depicts a photolithographic process step used to selectively etch and remove the conformal film 220B from the second side 235 of trench 224. A photoresist layer (216 and 218) has been applied to the dielectric layer 222 using a process such as spin coating, spray, or extrusion coating, to achieve a thin uniform coating across the dielectric layer 222, and to fill trench 224. A photomask 214 containing an aperture 215 may be then placed over the dielectric layer 222, and aligned so that the aperture 215 may expose the photoresist covering conformal film 220B on the second side 235 of the trench 224, but not the conformal film 220A on the first side 233 of the trench 224. Light may be then used to expose photoresist 218 while photoresist 216 remains unexposed. Unexposed photoresist layer 216 envelops the conformal film 220A on the first side 233 of the trench 224, while exposed photoresist layer 218 envelops the conformal film 220B on the second side 235 of the trench 224. This process step can be useful because it may employ currently available photolithographic process steps to expose the photoresist on only one selected side of the trench 224, but not on another side.

The photoresist process depicted in view 205 is a positive photoresist process, in which the portion of the photoresist that is exposed to light becomes soluble to a photoresist developer. The portion of the photoresist that is unexposed remains insoluble to the photoresist developer. Certain embodiments may make use of a negative photoresist process, in which the portion of the photoresist that is exposed to light becomes insoluble to the photoresist developer, and the unexposed portion of the photoresist is dissolved by the photoresist developer.

View 206 depicts the trench 224 following the removal of exposed photoresist 218 through a stripping process, and removal of the conformal film 220B using a selective etching process. Unexposed photoresist layer 216 envelops the conformal film 220A, having effectively masked it from the selective etching process. The selective etching process may not affect (increase) overall trench dimensions. The process steps depicted may be useful in removing conformal film from one side of the trench and leaving the conformal film remaining on the opposite side of the trench.

View 207 depicts the conformal film 220A on the first side 233 of the trench 224 after the unexposed photoresist layer 216 has been stripped away. The conformal film 220A may maintain a precisely controlled depth and thickness.

View 208 depicts the results of a blanket growth or deposition of an insulator 226 such as silicon dioxide (SiO$_2$) on the top surface of dielectric layer 222. The insulator growth may be thick enough to fill trench 224 to the top surface of dielectric layer 222, so that a subsequent planarization operation may restore dielectric layer 222 to its original profile (view 201). This step may completely fill the trench 224 except for the area occupied by the conformal film 220A, which may be encapsulated by the combination of dielectric layer 222 and insulator 226.

View 209 depicts the dielectric layer 222 after a planarization (leveling) operation of the insulator 226 layer, which may result in dielectric layer 222 having a planar surface profile consistent with view 201. The top surface of conformal film 220A may be exposed to allow it to be subject to further processing steps. This planarization step may include a chemical-mechanical polishing process, or other subtractive process such as milling, machining, or laser ablation. The planarization process may achieve a uniform specified flatness across the top surface of the dielectric layer 222, in accordance with IC manufacturing tolerances and specifications.

View 210 depicts the dielectric layer 222 after the removal of the conformal film 220A through a selective etching process, creating a receptacle 228 which may have a precisely controlled width and depth, consistent with the width of the conformal film 220 (view 203) and (etched) depth of trench 224 (view 202). The selective etch process may only remove conformal film 220A and may not affect dielectric layer 222. The created receptacle 228 may be useful for subsequent deposition of electrically resistive material.

View 210 also shows a second trench 232 having been formed using an etching process such as plasma etching or reactive ion etching (RIE), consistent with a process used to form trench 224 (view 202). Trench 232 may have a plurality of sides, and a bottom, and may be useful in containing a low ohmic connection consistent with low ohmic connection 134A, 134B (FIG. 1). A low ohmic connection formed in (second) trench 232 may adjoin receptacle 228, consistent with the depiction in FIG. 1.

View 211 depicts the results of depositing electrically resistive material 230 into receptacle 228 and trench 232, and onto the top surface of dielectric layer 222. The receptacle 228 may be filled completely, while the trench 232 may have one or more of its interior sides coated, but not completely filled with the electrically resistive material 230. The receptacle 228 is depicted as containing a resistive element with material of a known resistivity, and precisely controlled width, length and depth. The trench 232 may be prepared (lined with electrically resistive material 230) to receive conductive material 234. The resistor 230 may be coupled to low ohmic connection 234, similar to FIG. 1, by electrically resistive material 230 lining trench 232.

The deposition of electrically resistive material 230 may result from a physical vapor deposition (PVD) process such as sputter deposition or cathodic arc deposition, or a chemical vapor deposition (CVD) process. Electrically resistive material 230 may be titanium nitride (TiN) in one embodiment; however other electrically resistive materials may be chosen based on relative sheet resistance values or compatibility with a particular manufacturing process. Other electrically resistive materials may include but are not limited to nickel, nichrome, tantalum, hafnium, niobium, zirconium, vanadium, tungsten, tantalum nitride, indium oxide, copper silicide, tungsten nitride, and titanium nitride.

The resistivity of electrically resistive material 230 may be significantly greater than the resistivity of a material (e.g., copper) used for creating conductors within the IC. For example, the resistivity of electrically resistive material 230 may be between 100 and 200 times greater than the resistivity of a conductor material. Electrically resistive material 230 may also be useful as a liner material to prevent metal (e.g., copper) diffusion into dielectric layer 222.

View 212 depicts the results of processes used to deposit electrically conductive material into trench 232 to form a low ohmic connection 234, consistent with low ohmic connections 134A, 134B (FIG. 1), and to remove excess electrically resistive material 230 from the top surface of dielectric layer 222.

Deposition of electrically conductive material, for example copper, may include the use of a damascene process involving the deposition of a conductive seed layer on top of electrically resistive material 230, electroplating to fill the trench 232 with the electrically conductive material, and subsequent removal of excess electrically conductive material through a chemical-mechanical polishing process.

The structures resulting from process steps depicted in views 201 through 212 may be resistor 230 and low ohmic connection 234. Resistor 230 may have precisely controlled width, length and height, and low ohmic connection 234 may have robust electrical connections with predictable resistance between the electrically resistive material and a conductor, consistent with the connection depicted in FIG. 1. Specified and actual finished dimensions of structures depicted in views 201 through 212 may be generally constrained by design needs and manufacturing process tolerances.

Figure 2A:
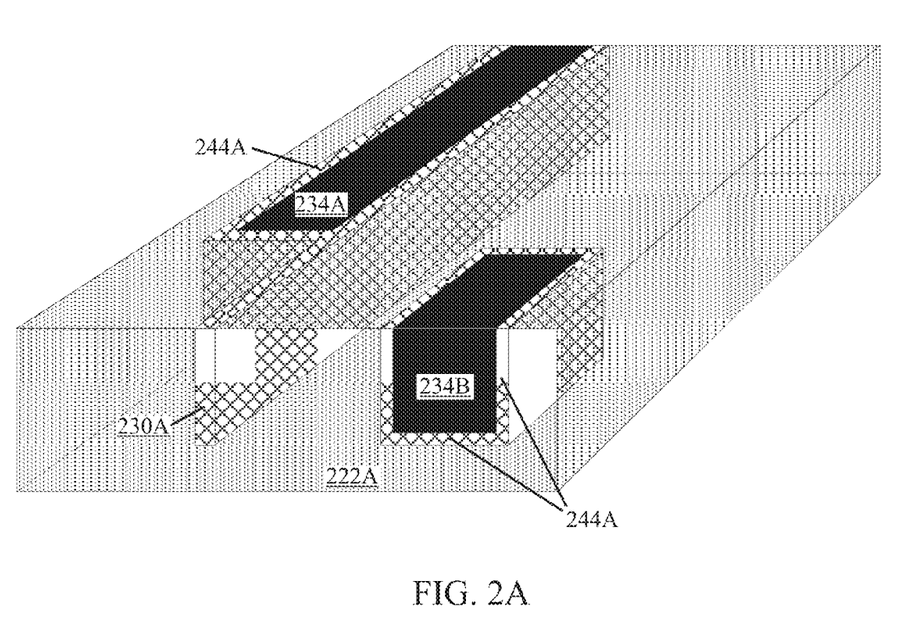
FIG. 2A is an isometric drawing of a dielectric layer of an IC, including a resistor and low ohmic connection areas to the resistor, according to embodiments of the present disclosure.

FIG. 2A is an isometric drawing of dielectric layer 222A, showing possible results of the process steps depicted in the twelve cross-sectional views (201 through 212) of FIG. 2, according to embodiments. FIG. 2A illustrates how resistor 230A may be formed and connected to low ohmic connection 234A, for example, in a manner consistent with resistor 130 and low ohmic connections 134A, 134B (FIG. 1).

Views 210, 211 and 212 (FIG. 2) illustrate the process of creating a resistor 230, and a low ohmic connection 234, while FIG. 2A further depicts the interconnection between the resistor 230A and low ohmic connection 234A. Low ohmic connections 234A, 234B are consistent with low ohmic connections 134A, 134B (FIG. 1), and low ohmic connection 234 (FIG. 2). Similarly, resistor 230A is consistent with resistor 130 (FIG. 1), and resistor 230 (FIG. 2). Electrically resistive material 244A is consistent with electrically resistive material 144 (FIG. 1) and resistor 230 (FIG. 2). Resistor 230A may have two low ohmic connections consistent with low ohmic connection 234A.

Figure 3:
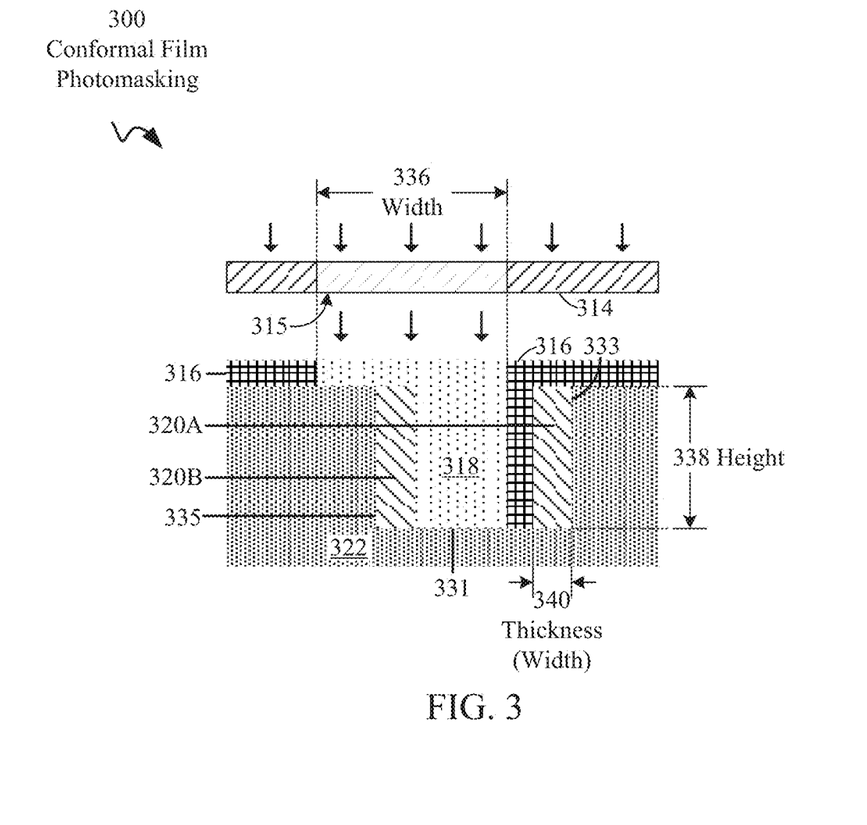
FIG. 3 is a dimensioned cross-sectional view of a photolithographic step in the creation of a precision IC resistor, according to embodiments.

FIG. 3 is a dimensioned cross-sectional view of a photolithographic step used in the creation of a precision IC resistor, and includes photomask aperture width 336, conformal film height 338, and conformal film thickness (width) 340, consistent with view 205 of FIG. 2, according to embodiments. The present disclosure may make use of accurately controlled physical dimensions that define a resistive structure, to achieve precise control (low tolerance) of the structure's resistance value.

In general, the resistance of a resistor having a rectangular cross-sectional area A, and length l, with terminals at each end of the length, may be determined in accordance with the following equations:

$$R = \rho \times \frac{l}{A}$$

Where:
R=resistance $\rho$=the intrinsic electrical resistivity of the material used in the resistive element
l=length of the resistive element
A=cross-sectional area of the resistive element and:

$$A = W \times H$$

Where:
A=cross-sectional area of the resistive element
W=width of the resistive element
H=height of the resistive element Referring to the equations above, "l" may be represented by resistive element length 142 (FIG. 1), "W" is represented by resistive element width 140 (FIG. 1) and 340 (FIG. 3), and "H" is represented by resistive element height 338 (FIG. 3). Resistive material intrinsic resistivity "$\rho$" may be the resistivity of electrically resistive material 230 (FIG. 2), for example, the resistivity of a deposited film of titanium nitride (TiN).

Each of the physical dimensions ("l", "W" and "H") used to define a resistive structure may be individually and accurately controlled by embodiments of the present disclosure in order to achieve precise control (low tolerance) of the structure's resistance.

For example, a resistive element may be fabricated to within 1% of a specified length "l", to within 2% of a specified width "W", and to within 2% of a specified height "H", in some embodiments. The intrinsic resistivity "$\rho$" of electrically resistive material 230 (FIG. 2) may vary by less than 5%, in some embodiments. The described close dimensional and resistivity tolerances may be used to create precision IC resistors having a tolerance of less than 10% of a specified resistance value, according to embodiments.

Conventional photolithographic process steps may impose both dimensional limitations and dimensional tolerance limitations on the sizes of resulting features. For example, the width 336 of aperture 315 in photomask 314 may be constrained to be equal to a fraction of the wavelength of the light used to expose a photoresist material. The width 336 may be specified to be the smallest possible value that may be still useful in patterning conductor trenches in an IC's dielectric layer. The relatively small width 336 (relative to an exposure light wavelength) may cause a relatively large variation in resulting feature sizes due to light diffraction effects at the photomask aperture. Variations in trench widths created using a photolithographic process, for example, may be unsuitably large for direct use in the creation of precision-dimensioned structures, such as resistors.

Embodiments of the present disclosure may make use of the relatively high dimensional precision that can be achieved by processes that can be tightly controlled, such as conformal film deposition, and dielectric material etching to overcome photolithographic dimension limitations and dimensional tolerance limitations.

FIG. 3 depicts aperture 315 of photomask 314 positioned to allow exposure of photoresist 318 (covering conformal film 320B), but to prohibit exposure of photoresist 316 (covering conformal film 320A) to light during a photolithographic process step. The photomask's 314 required positioning accuracy may be achievable using current mask registration techniques, and may be effectively used to select the conformal film on one side of a trench for removal. The thickness (width) 340 dimension of the conformal film 320A may be at least two times less than the minimum allowable aperture width 336, and in some cases, substantially less; in some applications, for example, it may be 10% of the aperture width 336.

Embodiments of the present disclosure may thus make use of the conformal film selection technique described herein, in conjunction with the relatively high dimensional precision which may be achievable through deposition and/or etch processes in order to overcome the dimensional limitations and dimensional tolerance limitations imposed by current photolithographic processes, in the creation of the precision resistor structures. Aspects of the present disclosure recognize that IC resistive structures having significantly smaller dimensions and (physical and electrical) tolerances than may be achievable using only current photolithographic processes may be created.

The dimensional precision achievable using conformal film deposition and etching processes may depend on the processes' relative speed and duration. Processes that progress more slowly may afford a greater degree of dimensional precision resulting from closely controlled process durations.

Figure 4:
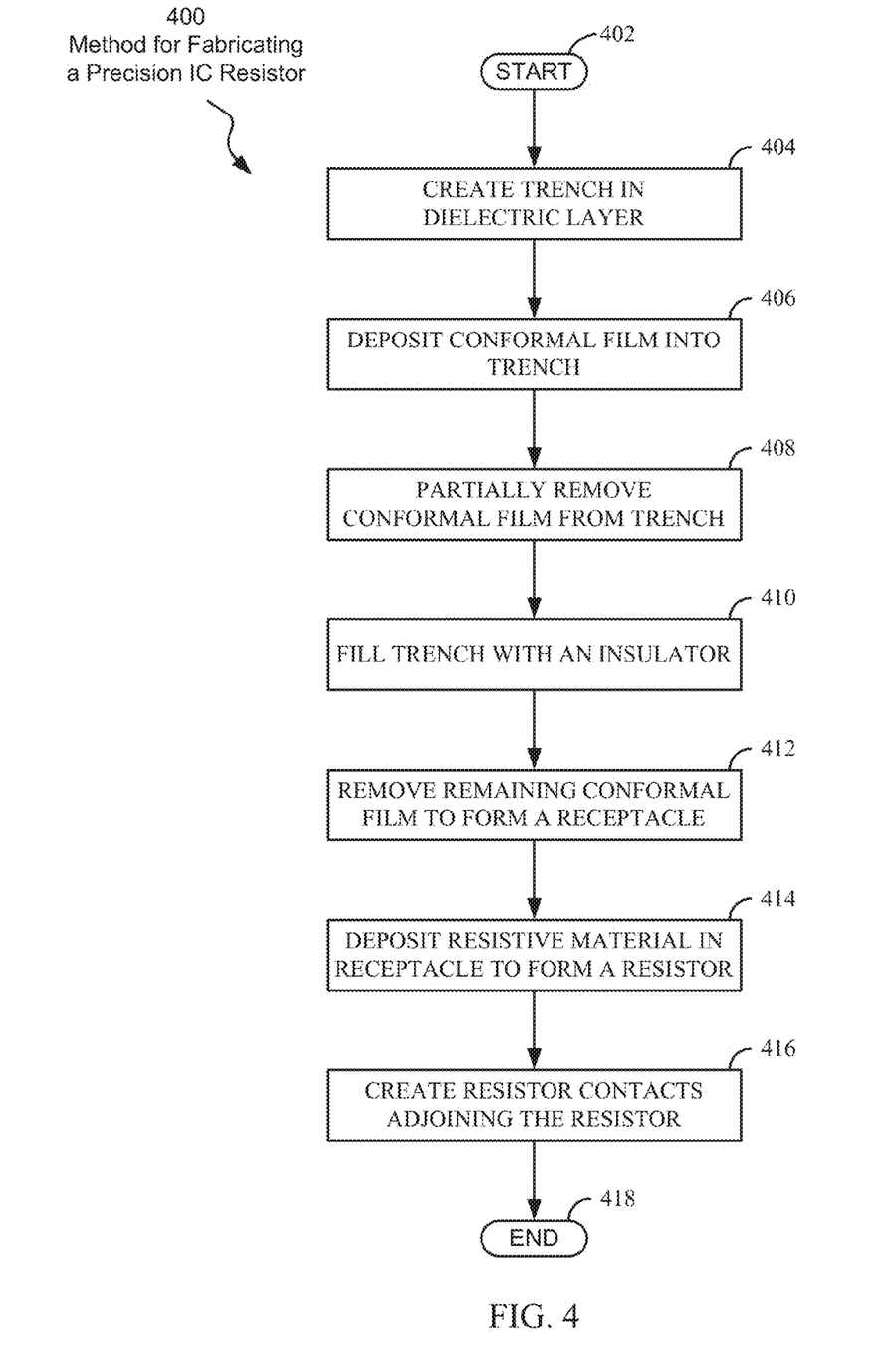
FIG. 4 is a flow diagram illustrating steps for fabricating a precision IC resistor, according to embodiments.

FIG. 4 is a flow diagram illustrating steps for fabricating a precision IC resistor, according to embodiments. The process 400 moves from start 402 to operation 404. Operation 404 generally refers to the process steps that involve creating a trench in a dielectric layer of an IC, which may correspond to the views provided by 201, 202 (FIG. 2) and their associated descriptions. The height and length of the trench sides may be closely controlled, through an etching process, and this control may be useful in precisely defining the dimensions of a resistive structure. Once a trench has been created in a dielectric layer of an IC, the process moves to operation 406.

Operation 406 generally refers to the process steps that involve depositing of a conformal film onto the bottom and sides of the trench formed in the dielectric layer, which may correspond to the views provided by 203 (FIG. 2) and their associated descriptions. The thickness (width) of the conformal film may be closely controlled, through a deposition process, and this control may be useful in precisely defining the width of a receptacle in which a resistive structure may be created. Once the conformal film has been deposited onto the bottom and sides of the trench in the dielectric layer, the process moves to operation 408.

Operation 408 generally refers to the process steps that involve partially removing the conformal film from the trench, which may correspond to the view provided by 204-207 (FIG. 2) and its associated description. A photolithographic process, including a photomask with an aperture, is used to select the conformal film on the bottom of the trench, and one side of the trench for removal. The remaining conformal film on the opposite side of the trench may then be used as a placeholder for creating a precisely dimensioned resistive structure. After the conformal film may be partially removed from the trench, the process moves to operation 410.

Operation 410 generally refers to the process steps that involves filling the trench created in the dielectric layer with an insulator, which may correspond to the views provided by 208, 209 (FIG. 2) and their associated descriptions. The trench may be filled in with an insulator, to enclose and surround the remaining conformal film, and subsequently planarized (leveled) back to the profile the original dielectric layer. After the trench is filled with the insulator, and the dielectric layer is planarized, the process moves to operation 412.

Operation 412 generally refers to the process steps that involve removing the conformal film remaining on one side of the trench, thereby creating a receptacle, which may correspond to the views provided by 210 (FIG. 2) and their associated descriptions. A selective etching operation is used to remove the remaining conformal film, and create a receptacle having the same precisely controlled dimensions as the conformal film, without altering the dielectric layer. A second trench may also be etched into the dielectric layer as a container for one or more low ohmic connections. After the remaining conformal film is removed, and a receptacle is formed, the process moves to operation 414.

Operation 414 generally refers to the process steps that involve depositing an electrically resistive material into the receptacle, which may correspond to the views provided by 211 (FIG. 2) and their associated descriptions. The electrically resistive material (for example, titanium nitride) may form the resistive element, and may also be used as a liner in the second trench to prevent electrically conductive material from diffusing into the dielectric layer. After depositing an electrically resistive material into the receptacle, the process moves to operation 416.

Operation 416 generally refers to the process steps that involve creating low ohmic connections adjoining the resistor, which may correspond to the views provided by 212 (FIG. 2) and their associated descriptions. A damascene process may be used to deposit electrically conductive material into the second trench, forming one or more low ohmic connections, which may be electrically connected to the resistive element. The damascene process may also include planarization, which may remove excess electrically conductive material from the top surface of the dielectric layer. After creating low ohmic connections adjoining the resistor, the process 400 may end at block 418.

The fabrication of a precision resistor structure may make use of multiple design structures including an input design structure that is preferably processed by a design process. The design structure may be a logical simulation design structure generated and processed by design process to produce a logically equivalent functional representation of a hardware device. The design structure may alternatively include data or program instructions that, when processed by a design process, generate a functional representation of the physical structure of a hardware device. Whether representing functional or structural design features, the design structure may be generated using electronic computer-aided design, such as that implemented by a core developer/designer. When encoded on a machine-readable data transmission, gate array, or storage medium, the design structure may be accessed and processed by one or more hardware or software modules within a design process to simulate or otherwise functionally represent an electronic component, circuit, electronic or logic module, apparatus, device, or system such as those shown in the figures. As such, the design structure may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

A design process preferably employs and incorporates hardware or software modules for synthesizing, translating, or otherwise processing a design/simulation functional equivalent of the components, circuits, devices, or logic structures shown in the figures to generate a netlist which may contain design structures. A netlist may comprise, for example, compiled or otherwise processed data structures representing a list of wires, discrete components, logic gates, control circuits, I/O devices, models, etc. that describe the connections to other elements and circuits in an integrated circuit design. The netlist may be synthesized using an iterative process in which the lowercase that is resynthesized one or more times depending on design specifications and parameters for the device. As with other design structure types described herein, the lowercase that may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

A design process may include hardware and software modules for processing a variety of input data structure types including the netlist. Such data structure types may reside, for example, within library elements and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications, characterization data, verification data, design rules, and test data files which may include input test patterns, output test results, and other testing information. A design process may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in the design process, without deviating from the scope and spirit of the invention. A design process may also include modules for performing standard circuit design processes such as timing analysis, verification, design rule checking, place and route operations, etc.

The design process employs and incorporates logic and physical design tools such as HDL compilers and simulation model build tools to process the design structure together with some or all of the depicted supporting data structures, along with any additional mechanical design or data, to generate a secondary design structure. The secondary design structure resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to the design structure, the secondary design structure preferably comprises one or more files, data structures, or other computer-encoded data or instructions that reside on transmission or data storage media and that, when processed by an ECAD system, generate a logically or otherwise functionally equivalent form of one or more of the embodiments of the invention shown in the figures. In one embodiment, the secondary design structure may comprise a compiled, executable HDL simulation model that functionally simulates the devices shown in the figures.

The secondary design structure may also employ a data format used for the exchange of layout data of integrated circuits and/or symbolic data format (e.g., information stored in a GDSII, GL1, OASIS, map files, or any other suitable format for storing such design data structures). The secondary design structure may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in the figures. The secondary design structure may then proceed to a state where, for example, it proceeds to tape-out, is released to manufacturing, is released to a mask house, is sent to another design house, is sent back to the customer, etc.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A method for fabricating a resistor in a dielectric layer of an integrated circuit (IC), comprising:
    creating a trench in the dielectric layer, the trench having a first side, a second side opposing the first side and a bottom;
    depositing a conformal film onto the first side, the second side and the bottom of the trench;
    removing the conformal film from the bottom and the second side of the trench;
    filling the trench with an insulator;
    removing the conformal film from the first side of the trench to form a receptacle adjacent to the insulator; and
    depositing electrically resistive material into the receptacle to form a resistor.

2. The method of claim 1, wherein the dielectric layer of the IC is silicon dioxide.

3. The method of claim 1, wherein creating a trench in the dielectric layer includes at least one process from a set of processes consisting of plasma etching and reactive ion etching.

4. The method of claim 1, wherein the conformal film is silicon nitride.

5. The method of claim 1, wherein removing the conformal film from the bottom of the trench includes applying an anisotropic etching process.

6. The method of claim 1, wherein the insulator is silicon dioxide.

7. The method of claim 1, wherein the electrically resistive material includes at least one material from a set of materials consisting of nickel, nichrome, tantalum, hafnium, niobium, zirconium, vanadium, tungsten, tantalum nitride, indium oxide, copper silicide, tungsten nitride, and titanium nitride.

8. The method of claim 1, wherein depositing electrically resistive material into the receptacle includes at least one process from a set of processes consisting of sputter deposition, cathodic arc deposition and chemical vapor deposition.

9. A method for fabricating a resistor with low ohmic connection areas in a dielectric layer of an integrated circuit (IC), comprising:
    creating a first trench in the dielectric layer, the first trench having a first side, a second side opposing the first side and a bottom;
    depositing a conformal film onto the first side, the second side and the bottom of the first trench;
    removing the conformal film from the bottom and the second side of the first trench;
    filling the first trench with an insulator;
    removing the conformal film from the first side of the first trench to form a receptacle adjacent to the insulator;
    creating a second trench adjoining the receptacle, the second trench having a plurality of sides and a bottom;

depositing electrically resistive material onto at least one side and the bottom of the second trench and into the receptacle to form a resistor in the receptacle; and filling the second trench with a conductive material to form a low ohmic connection.

10. The method of claim 9, wherein removing the conformal film from the second side of the first trench involves using a photolithographic process having a mask with an aperture.

11. The method of claim 10, wherein the aperture of the mask is positioned to expose the conformal film on the second side of the first trench to light during the photolithographic process and to block the conformal film on the first side of the first trench from exposure to light during the photolithographic process.

12. The method of claim 11, wherein a minimum allowable aperture width of the photolithographic process is greater than a thickness of the conformal film on the first side of the first trench.

13. The method of claim 11, wherein a ratio of the minimum allowable aperture width to the thickness of the conformal film on the first side of the first trench is greater than 2:1.

14. The method of claim 9, wherein a depth of the first trench and the thickness of the conformal film on the first side of the first trench affect a resistance of the resistor.

15. The method of claim 14, wherein the resistance is within 10% of a specified resistance.

16. The method of claim 9, wherein the conductive material is copper.

17. The method of claim 9, wherein the conductive material is aluminum.

18. A method for fabricating a resistor in a dielectric layer of an integrated circuit (IC), comprising:

creating a trench of a controlled depth in the dielectric layer, the trench having a first side, a second side opposing the first side and a bottom;

depositing a conformal film of a controlled thickness onto the first side, the second side and the bottom of the trench;

removing the conformal film from the bottom of the trench;

applying a mask having a minimum allowable aperture width at least two times greater than the controlled thickness of the conformal film on the first side of the trench;

removing the conformal film from the second side of the trench by positioning an aperture of the mask to expose the conformal film on the second side of the trench to light during a photolithographic process and to block the conformal film on the first side of the trench from exposure to light during the photolithographic process;

filling the trench with an insulator;

removing the conformal film from the first side of the trench to form a receptacle adjacent to the insulator; and depositing electrically resistive material into the receptacle, to form a resistor with a controlled resistance.

\* \* \* \* \*